United States Patent
Sasaki

[11] Patent Number: 5,956,358
[45] Date of Patent: *Sep. 21, 1999

[54] SEMICONDUCTOR LASER HAVING AN IMPROVED LATERAL CARRIER INJECTION STRUCTURE TO MULTIPLE QUANTUM WELL LAYERS

[75] Inventor: Yoshihiro Sasaki, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/606,314

[22] Filed: Feb. 23, 1996

[30]     Foreign Application Priority Data

Feb. 23, 1995  [JP]  Japan ................................ 7-058282

[51] Int. Cl.$^6$ ...................................................... H01S 3/19
[52] U.S. Cl. ................................................ 372/45; 372/46
[58] Field of Search .................................. 372/45, 46, 43

[56]     References Cited

U.S. PATENT DOCUMENTS

| | | | |
|---|---|---|---|
| 4,752,934 | 6/1988 | Fukuzawa et al. | 372/45 |
| 5,018,159 | 5/1991 | Suzuki et al. | 372/45 |
| 5,107,514 | 4/1992 | Goto | 372/45 |
| 5,559,820 | 9/1996 | Kumura et al. | 372/45 |

FOREIGN PATENT DOCUMENTS

| | | | |
|---|---|---|---|
| 2-201989 | 8/1990 | Japan | 372/45 |
| 2-298090 | 12/1990 | Japan | 372/45 |

*Primary Examiner*—Rodney Bovernick
*Assistant Examiner*—Yisun Song
*Attorney, Agent, or Firm*—Young & Thompson

[57]     ABSTRACT

The present invention also provides another semiconductor multilayer carrier injection structure in a semiconductor laser. The semiconductor multilayer carrier injection structure comprises the following elements. The semiconductor multilayer carrier injection structure includes a multiple quantum well active layer comprising alternating laminations of quantum well layers made of a first compound semiconductor having a first energy band gap and potential barrier layers made of a second compound semiconductor having a second energy band gap larger than the first energy band gap. Each of the quantum well layers has an electron ground state of quantum energy levels of electrons and a hole ground state of quantum energy levels of holes. The semiconductor multilayer carrier injection structure also includes a first carrier injection guide layer being provided in contact with a first lateral end portion of the multiple quantum well active layer. The first carrier injection guide layer is made of a third compound semiconductor of a first conductivity type. The third compound semiconductor has a third energy band gap which is larger than a difference between the electron ground state and the hole ground state of the quantum well layers and which is smaller than the second energy band gap of the potential barrier layers. The semiconductor multilayer carrier injection structure also includes a second carrier injection guide layer being provided in contact with a second lateral end portion of the multiple quantum well active layer. The second carrier injection guide layer is made of a fourth compound semiconductor of a second conductivity type. The fourth compound semiconductor has a fourth energy band gap which is larger than the difference between the electron ground state and the hole ground state of the quantum well layers and substantially equal to or smaller than the second energy band gap of the potential barrier layers.

25 Claims, 5 Drawing Sheets

SEMICONDUCTOR LASER HAVING AN IMPROVED LATERAL CARRIER INJECTION STRUCTURE TO MULTIPLE QUANTUM WELL LAYERS

BACKGROUND OF THE INVENTION

The present invention relates to a semiconductor laser and a method for fabricating the same, and more particularly to a compound semiconductor laser having an improved carrier injection structure for injecting carriers to multiple quantum well layers and a method for fabricating the same.

There has been known various conventional vertical carrier injection multiple quantum well laser device, wherein carriers, for example electrons and holes are injected into a multiple quantum well active layer in a direction vertical to a surface of the multiple quantum well active layer. FIG, 1 illustrates energy band gap profiles. FIG. 2 illustrates electron and hole densities in individual quantum well layers. Since electrons have a small effective mass whilst holes have a larger effective mass and further electrons and holes are pulled to each other by, coulomb force, both the electron and hole densities are high in a quantum well layer near the p-side electrode and they are low in a quantum well layer near the n-side electrode. FIG. 2 shows a large difference of each of the electron and holes densities in individual quantum well layers. This large difference prevents increasing the number of multiple quantum well layers, thereby resulting in a difficulty in obtaining a high gain of power. This is disclosed in N. Tessler et pal. 13th IEEE Semicon. Laser Conf. 1992 D5, 44.

SUMMARY OF THE INVENTION

Accordingly, it is an object of the present invention to provide a novel semiconductor multilayer carrier injection structure free from the problems as described above.

It is another object of the present invention to provide a novel semiconductor multilayer carrier injection structure included in a laser device, which is free from the problems as described above.

It is still another object of the present invention to provide a novel laser device having an improved semiconductor multilayer carrier injection structure which is free from the problems as described above.

It is yet another object of the present invention to provide a novel method for fabricating a novel laser device having an improved semiconductor multilayer carrier injection structure which is free from the problems as described above.

The above and other objects, features and advantages of the present invention will be apparent from the following descriptions.

The present invention provides a semiconductor multilayer carrier injection structure which comprises the following elements. The semiconductor multilayer carrier injection structure includes a multiple quantum well active layer comprising alternating laminations of quantum well layers made of a first compound semiconductor having a first energy band gap and potential barrier layers made of a second compound semiconductor having a second energy band gap larger than the first energy band gap. Each of the quantum well layers has an electron ground state of quantum energy levels of electrons and a hole ground state of quantum energy levels of holes.

The semiconductor multilayer carrier injection structure further includes a first carrier injection guide layer being provided in contact with a first lateral end portion of the multiple quantum well active layer. The first carrier injection guide layer is made of a third compound semiconductor of a first conductivity type. The third compound semiconductor has a third energy band gap which is larger than a difference between the electron ground state and the hole ground state of the quantum well layers and which is smaller than the second energy band gap of the potential barrier layers.

Carriers of the first conductivity type are injected via the first carrier injection guide layer into the quantum well layers uniformly in a direction substantially parallel to interfaces between the quantum well layers and the potential barrier layers. As described above, the first carrier injection guide layer has the energy band gap smaller than the energy band gap of the potential barrier layers in the multiple quantum well active layer. The energy band gap of the first carrier injection guide layer is, however, larger than the difference between the ground state of the quantum energy levels of electrons confined in the quantum wells and the ground state of the quantum energy levels of holes confined in the quantum wells. This difference between the electron and hole ground states is necessarily larger than the energy band gap of the quantum well layers. Accordingly, the carriers of the first conductivity type, except for exceptional carriers thermally excited, are necessarily injected into the quantum well layers and well confined therein. Namely, almost all of the carriers of the first conductivity type are certainly injected into the quantum well layers uniformly. If in the quantum well layers carriers of the second conductivity type are also confined, then radiative recombinations of electron-hole pairs are caused at an extremely high probability. The above carrier injection structure provides an extremely high injection rate for the carriers of the first conductivity type into the quantum well layers.

It may be optionally available to further provide a second carrier injection guide layer in contact with a second lateral end portion of the multiple quantum well active layer. The second carrier injection guide layer is made of a fourth compound semiconductor of a second conductivity type. The fourth compound semiconductor has a fourth energy band gap which is larger than the difference between the electron ground state and the hole ground state of the quantum well layers and substantially equal to or smaller than the second energy band gap of the potential barrier layers. In this case carriers of the second conductivity type are injected via the second carrier injection guide layer into the quantum well layers uniformly in a direction substantially parallel to interfaces between the quantum well layers and the potential barrier layers.

As described above, the second carrier injection guide layer has the energy band gap substantially equal to or smaller than the energy band gap of the potential barrier layers in the multiple quantum well active layer. The carriers of the second conductivity type are pulled toward the carriers of the first conductivity type confined in the quantum well layers by coulomb force and then injected into the quantum well layers even if the second carrier injection guide layer has an energy substantially equal to the energy band gap of the potential barrier layers. The energy band gap of the second carrier injection guide layer is, however, larger than the difference between the ground state of the quantum energy levels of electrons confined in the quantum wells and the ground state of the quantum energy levels of holes confined in the quantum wells. This difference between the electron and hole ground states is necessarily larger than the energy band gap of the quantum well layers. Accordingly, the carriers of the second conductivity type, except for exceptional carriers thermally excited, are necessarily injected into the quantum well layers and well confined therein. Namely, almost all of the carriers of the second conductivity type are certainly injected into the quantum well layers uniformly. Since the carriers of the first conductivity type, except for exceptional carriers thermally excited, are also necessarily injected into the quantum well layers and well-confined therein, radiative recombinations of electron-hole pairs are caused at an extremely high probability. The above carrier injection structure provides an extremely light emission efficiency versus an injection current value, namely an extremely high slope efficiency.

The present invention also provides a semiconductor laser having this semiconductor multilayer carrier injection structure.

BRIEF DESCRIPTIONS OF THE DRAWINGS

Preferred embodiments according to the present invention will be described in detail with reference to the accompanying drawings.

DISCLOSURE OF THE INVENTION

Figure 1:
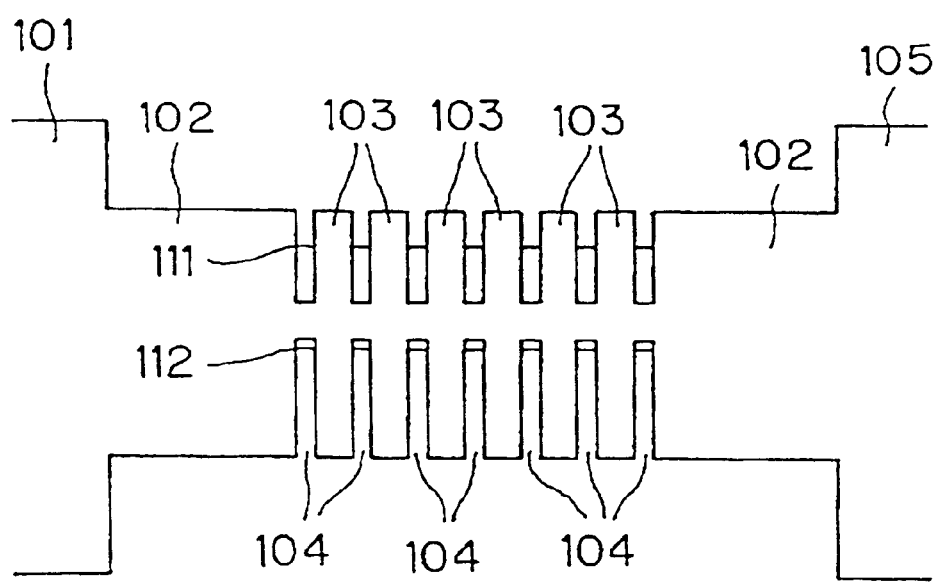
FIG. 1 is a diagram illustrative of energy band gap profiles of the conventional multiple quantum well laser device.
Figure 2:
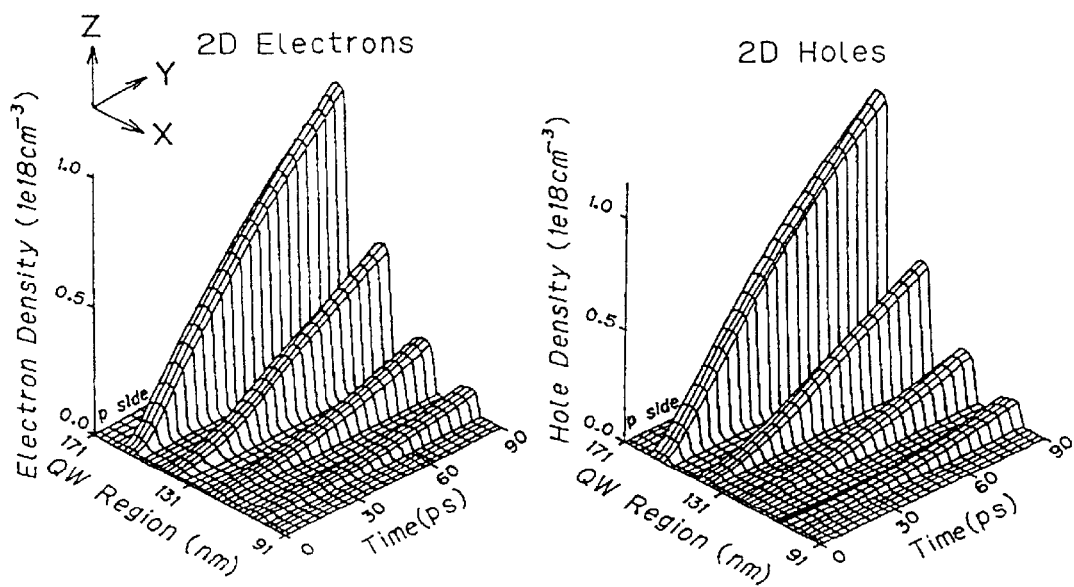
FIG. 2 is a diagram illustrative of electron and hole densities in quantum well layers, wherein electrons and holes are injected in a vertical direction to interfaces of multiple quantum wall layers and potential barrier layers.

The present invention provides a semiconductor multilayer carrier injection structure which comprises the following elements. The semiconductor multilayer carrier injection structure includes a multiple quantum well active layer comprising alternating laminations of quantum well layers made of a first compound semiconductor having a first energy band gap and potential barrier layers made of a second compound semiconductor having a second energy band gap larger than the first energy band gap. Each of the quantum well layers has an electron ground state of quantum energy levels of electrons and a hole ground state of quantum energy levels of holes.

The semiconductor multilayer carrier injection structure further includes a first carrier injection guide layer being provided in contact with a first lateral end portion of the multiple quantum well active layer. The first carrier injection guide layer is made of a third compound semiconductor of a first conductivity type. The third compound semiconductor has a third energy band gap which is larger than a difference between the electron ground state and the hole ground state of the quantum well layers and which is smaller than the second energy band gap of the potential barrier layers.

Carriers of the first conductivity type are injected via the first carrier injection guide layer into the quantum well layers uniformly in a direction substantially parallel to interfaces between the quantum well layers and the potential barrier layers. As described above, the first carrier injection guide layer has the energy band gap smaller than the energy band gap of the potential barrier layers in the multiple quantum well active layer. The energy band gap of the first carrier injection guide layer is, however, larger than the difference between the ground state of the quantum energy levels of electrons confined in the quantum wells and the ground state of the quantum energy levels of holes confined in the quantum wells. This difference between the electron and hole ground states is necessarily larger than the energy band gap of the quantum well layers. Accordingly, the carriers of the first conductivity type, except for exceptional carriers thermally excited, are necessarily injected into the quantum well layers and well confined therein. Namely, almost all of the carriers of the first conductivity type are certainly injected into the quantum well layers uniformly. If in the quantum well layers carriers of the second conductivity type are also confined, then radiative recombinations of electron-hole pairs are caused at an extremely high probability. The above carrier injection structure provides an extremely high injection rate for the carriers of the first conductivity type into the quantum well layers.

It may be optional to further provide a second carrier injection guide layer in contact with a second lateral end portion of the multiple quantum well active layer. The second carrier injection guide layer is made of a fourth compound semiconductor of a second conductivity type. The fourth compound semiconductor has a fourth energy band gap which is larger than the difference between the electron ground state and the hole ground state of the quantum well layers and substantially equal to or smaller than the second energy band gap of the potential barrier layers. In this case carriers of the second conductivity type are injected via the second carrier injection guide layer into the quantum well layers uniformly in a direction substantially parallel to interfaces between the quantum well layers and the potential barrier layers.

As described above, the second carrier injection guide layer has the energy band gap substantially equal to or smaller than the energy band gap of the potential barrier layers in the multiple quantum well active layer. The carriers of the second conductivity type are pulled toward the carriers of the first conductivity type confined in the quantum well layers by coulomb force and then injected into the quantum well layers even if the second carrier injection guide layer has an energy substantially equal to the energy band gap of the potential barrier layers. The energy band gap of the second carrier injection guide layer is, however, larger than the difference between the ground state of the quantum energy levels of electrons confined in the quantum wells and the ground state of the quantum energy levels of holes confined in the quantum wells. This difference between the electron and hole ground states is necessarily larger than the energy band gap of the quantum well layers. Accordingly, the carriers of the second conductivity type, except for exceptional carriers thermally excited, are necessarily injected into the quantum well layers and well confined therein. Namely, almost all of the carriers of the second conductivity type are certainly injected into the quantum well layers uniformly. Since the carriers of the first conductivity type, except for exceptional carriers thermally excited, are also necessarily injected into the quantum well layers and well-confined therein, radiative recombinations of electron-hole pairs are caused at an extremely high probability. The above carrier injection structure provides an extremely light emission efficiency versus an injection current value, namely an extremely high slope efficiency.

It may be optional to further provide top and bottom layers. The top layer is provided on a top surface of the multiple quantum well active layer. The top layer is made of a first material having a first resistivity higher than a resistivity of the first carrier injection guide layer and also higher than a resistivity of the potential barrier layers. The bottom layer is provided on a bottom surface of the multiple quantum well active layer. The bottom layer is made of a second material having a second resistivity higher than a resistivity of the first carrier injection guide layer and also higher than a resistivity of the potential barrier layers.

The first and second materials may be either a semi-insulating material or an insulating material.

It may be optional to further provide a first electrode in contact with the first carrier injection guide layer. The first electrode is separated by the first carrier injection guide layer from the multiple quantum well active layer.

It may be optional to further provide a second electrode in contact with the second carrier injection guide layer, The second electrode is separated by the second carrier injection guide layer from the multiple quantum well active layer.

It may be optional to further provide a first channel buried layer in contact with the first carrier injection guide layer. The first channel buried layer is separated via the first carrier injection guide layer from the multiple quantum well active layer. The first channel buried layer is made of a fifth compound semiconductor of the first conductivity type having a fifth energy band gap larger than the third energy band gap of the first carrier injection guide layer. In this case, it may be optional to further provide a first electrode in contact with the first channel buried layer and being separated via the first channel buried layer from the first carrier injection guide layer. In this case, the fifth compound semiconductor of the first channel buried layer may be made of InP.

It may be optional to further provide a second channel buried layer in contact with the second carrier injection guide layer. The second channel buried layer is separated via the second carrier injection guide layer from the multiple quantum well active layer. The second channel buried layer is made of a sixth compound semiconductor of the second conductivity type having a sixth energy band gap larger than the fourth energy band gap of the second carrier injection guide layer. In this case, it may be optional to further provide a second electrode being provided in contact with the second channel buried layer and being separated via the second channel buried layer from the second carrier injection guide layer. In this case, the sixth compound semiconductor of the second channel buried layer may be made of InP.

It are also available that each of the quantum well layers is made of InGaAsP of a wavelength composition of 1.4 micrometers and has a thickness of 5.5 nanometers, and that each of the potential barrier layers is made of InGaAsP of a wavelength composition of 1.05 micrometers and has a thickness of 10 nanometers, wherein the difference between the electron ground state and the hole ground state of the quantum well layers corresponds to an energy converted into a wavelength of 1.3 micrometers. In this case, the multiple quantum well active layer comprises 15 periods of the quantum well layers and the potential barrier layers. In this case, it is also available that the third compound semiconductor of the first carrier injection guide layer comprises InGaAsP of a wavelength composition of 1.13 micrometers. In this case, the first carrier injection guide layer has a thickness of approximately 100 nanometers.

It are also available that each of the quantum well layers is made of InGaAsP of a wavelength composition of 1.4 micrometers and has a thickness of 5.5 nanometers, and that each of the potential barrier layers is made of InGaAsP of a wavelength composition of 1.05 micrometers and has a thickness of 10 nanometers, wherein the difference between the electron ground state and the hole ground state of the quantum well layers corresponds to an energy converted into a wavelength of 1.3 micrometers, and the fourth compound semiconductor of the second carrier injection guide layer comprises InGaAsP of a wavelength composition of 1.13 micrometers. In this case, it may be available that the second carrier injection guide layer has a thickness of approximately 100 nanometers.

It are also available that each of the quantum well layers is made of InGaAsP of a wavelength composition of 1.4 micrometers and has a thickness of 6.2 nanometers, and that each of the potential barrier layers is made of InP and has a thickness of 10 nanometers, wherein the difference between the electron ground state and the hole ground state of the quantum well layers corresponds to an energy converted into a wavelength of 1.3 micrometers. In this case, it may be available that the third compound semiconductor of the first carrier injection guide layer comprises InGaAsP of a wavelength composition of 1.13 micrometers. In this case, it may be available that the third compound semiconductor of the first carrier injection guide layer comprises InP. In this case, it may be available that the multiple quantum well active layer comprises 5 periods of the quantum well layers and the potential barrier layers. In this case, it may be available that the first carrier injection guide layer has a thickness of approximately 100 nanometers.

It may be available that each of the quantum well layers is made of InGaAsP of a wavelength composition of 1.4 micrometers and has a thickness of 6.2 nanometers, and that each of the potential barrier layers is made of InP and has a thickness of 10 nanometers, wherein the difference between the electron ground state and the hole ground state of the quantum well layers corresponds to an energy converted into a wavelength of 1.3 micrometers, and the fourth compound semiconductor of the second carrier injection guide layer comprises InGaAsP of a wavelength composition of 1.13 micrometers. In this case, it may be available that the second carrier injection guide layer has a thickness of approximately 100 nanometers.

Alternatively, it may be available that each of the quantum well layers is made of InGaAsP of a wavelength composition of 1.4 micrometers and has a thickness of 6.2 nanometers, and that each of the potential barrier layers is made of InP and has a thickness of 10 nanometers, wherein the difference between the electron ground state and the hole ground state of the quantum well layers corresponds to an energy converted into a wavelength of 1.3 micrometers, and the fourth compound semiconductor of the second carrier injection guide layer comprises InP. In this case, it may be available that the second carrier injection guide layer has a thickness of approximately 100 nanometers.

It may optionally be available that the quantum well layers and the potential barrier layers are strained layers.

It may optionally be available to further provide a contact layer between the first electrode and the first channel buried layer. The contact layer is made of a seventh compound semiconductor of a degenerate state, wherein the first electrode is made of a conductive metal to form an ohmic contact.

Any Group III-V compound semiconductors of a direction transition type as well as any Group II-IV compound semiconductors are available as the compound semiconductor of the quantum well layers. Group III elements are, for example, Al, Ga and In. Group V elements are, for example, P, As and Sb. Group II elements are, for example, Zn and Cd. Group IV elements are, for example, S and Se.

The present invention also provides another semiconductor multilayer carrier injection structure in a semiconductor laser. The semiconductor multilayer carrier injection structure comprises the following elements. The semiconductor multilayer carrier injection structure includes a multiple quantum well active layer comprising alternating laminations of quantum well layers made of a first compound semiconductor having a first energy band gap and potential barrier layers made of a second compound semiconductor having a second energy band gap larger than the first energy band gap. Each of the quantum well layers has an electron ground state of quantum energy levels of electrons and a hole ground state of quantum energy levels of holes.

The semiconductor multilayer carrier injection structure also includes a first carrier injection guide layer being provided in contact with a first lateral end portion of the multiple quantum well active layer. The first carrier injection guide layer is made of a third compound semiconductor of at first conductivity type. The third compound semiconductor has a third energy band gap which is larger than a difference between the electron ground state and the hole ground state of the quantum well layers and which is smaller than the second energy band gap of the potential barrier layers.

The semiconductor multilayer carrier injection structure also includes a second carrier injection guide layer being provided in contact with a second lateral end portion of the multiple quantum well active layer. The second carrier injection guide layer is made of a fourth compound semiconductor of a second conductivity type. The fourth compound semiconductor has a fourth energy band gap which is larger than the difference between the electron ground state and the hole ground state of the quantum well layers and substantially equal to or smaller than the second energy band gap of the potential barrier layers.

Carriers of the first conductivity type are injected via the first carrier injection guide layer into the quantum well layers uniformly in a direction substantially parallel to interfaces between the quantum well layers and the potential barrier layers. As described above, the first carrier injection guide layer has the energy band gap smaller than the energy band gap of the potential barrier layers in the multiple quantum well active layer. The energy band gap of the first carrier injection guide layer is, however, larger than the difference between the ground state of the quantum energy levels of electrons confined in the quantum wells and the ground state of the quantum energy levels of holes confined in the quantum wells. This difference between the electron and hole ground states is necessarily larger than the energy band gap of the quantum well layers. Accordingly, the carriers of the first conductivity type, except for exceptional carriers thermally excited, are necessarily injected into the quantum well layers and well confined therein. Namely, almost all of the carriers of the first conductivity type are certainly injected into the quantum well layers uniformly. The above carrier injection structure provides an extremely high injection rate for the carriers of the first conductivity type into the quantum well layers. Further, the second carrier injection guide layer also has the energy band gap substantially equal to or smaller than the energy band gap of the potential barrier layers in the multiple quantum well active layer. The carriers of the second conductivity type are pulled toward the carriers of the first conductivity type confined in the quantum well layers by coulomb force and then injected into the quantum well layers even if the second carrier injection guide layer has an energy substantially equal to the energy band gap of the potential barrier layers. The energy band gap of the second carrier injection guide layer is, however, larger than the difference between the ground state of the quantum energy levels of electrons confined in the quantum wells and the ground state of the quantum energy levels of holes confined in the quantum wells. This difference between the electron and hole ground states is necessarily larger than the energy band gap of the quantum well layers. Accordingly, the carriers of the second conductivity type, except for exceptional carriers thermally excited, are necessarily injected into the quantum well layers and well confined therein. Namely, almost all of the carriers of the second conductivity type are certainly injected into the quantum well layers uniformly. Since the carriers of the first and second conductivity type, except for exceptional carriers thermally excited, are necessarily injected into the quantum well layers and well-confined therein, radiative recombinations of electron-hole pairs are caused at an extremely high probability. The above carrier injection structure provides an extremely light emission efficiency versus an injection current value, namely an extremely high slope efficiency.

It may optionally be available to further provide a top layer being provided on a top surface of the multiple quantum well active layer. The top layer is made of a first material having a first resistivity higher than a resistivity of the first carrier injection guide layer and also higher than a resistivity of the potential barrier layers.

It may optionally be available to further provide a bottom layer being provided on a bottom surface of the multiple quantum well active layer. The bottom layer is made of a second material having a second resistivity higher than a resistivity of the first carrier injection guide layer and also higher than a resistivity of the potential barrier layers.

The first and second materials may be either a semi-insulating material or an insulating material.

It may optionally be available to further provide a first electrode in contact with the first carrier injection guide layer. The first electrode is separated by the first carrier injection guide layer from the multiple quantum well active layer.

It may optionally be available to further provide a second electrode in contact with the second carrier injection guide layer. The second electrode is separated by the second carrier injection guide layer from the multiple quantum well active layer.

It may optionally be available to further provide a first channel buried layer in contact with the first carrier injection guide layer. The first channel buried layer is separated via the first carrier injection guide layer from the multiple quantum well active layer. The first channel buried layer is made of a fifth compound semiconductor of the first conductivity type having a fifth energy band gap larger than the third energy band gap of the first carrier injection guide layer. In this case, it may optionally be available to further provide a first electrode in contact with the first channel buried layer. The first electrode is separated via the first channel buried layer from the first carrier injection guide layer.

It may optionally be available to further provide a second channel buried layer in contact with the second carrier injection guide layer. The second channel buried layer is separated via the second carrier injection guide layer from the multiple quantum well active layer. The second channel buried layer is made of a sixth compound semiconductor of the second conductivity type having a sixth energy band gap larger than the fourth energy band cap of the second carrier injection guide layer. In this case, it may optionally be available to further provide a second electrode in contact with the second channel buried layer. The second electrode is separated via the second channel buried layer from the second carrier injection guide layer. In this case, it may be available that the fifth compound semiconductor of the first channel buried layer is made of InP, and that the sixth compound semiconductor of the second channel buried layer is made of InP.

It may advantageously be available that each of the quantum well layers is made of InGaAsP of a wavelength composition of 1.4 micrometers and has a thickness of 5.5 nanometers, and that each of the potential barrier layers is made of InGaAsP of a wavelength composition of 1.05 micrometers and has a thickness of 10 nanometers, wherein the difference between the electron ground state and the hole ground state of the quantum well layers corresponds to an energy converted into a wavelength of 1.3 micrometers. In this case, it may, be available that the multiple quantum well active layer comprises 15 periods of the quantum well layers and the potential barrier layers. In this case, it may be available that the third and fourth compound semiconductors of the first and second carrier injection guide layers comprise InGaAsP of a wavelength composition of 1.13 micrometers. In this case, it may be available that the first and second carrier injection guide layers have a thickness of approximately 100 nanometers.

It may advantageously be available that each of the quantum well layers is made of InGaAsP of a wavelength composition of 1.4 micrometers and has a thickness of 6.2 nanometers, and that each of the potential barrier layers is made of InP and has a thickness of 10 nanometers, wherein the difference between the electron ground state and the hole ground state of the quantum well layers corresponds to an energy converted into a wavelength of 1.3 micrometers. In this case, it may be available that the third and fourth compound semiconductors of the first and second carrier injection guide layers comprise InGaAsP of a wavelength composition of 1.13 micrometers. In this case, it may be available that the third and fourth compound semiconductors of the first and second carrier injection guide layers comprise InP. In this case, it may be available that the multiple quantum well active layer comprises 5 periods of the quantum well layers and the potential barrier layers. In this case, it may be available that the first and second carrier injection guide layers have a thickness of approximately 100 nanometers.

It may optionally be available that the quantum well layers and the potential barrier layers are strained layers.

It may optionally be available to further provides at least a first contact layer between the first electrode and the first channel buried layer. The first contact layer is made of a seventh compound semiconductor of a degenerate state, wherein the first electrode is made of a conductive metal to form an ohmic contact.

It may optionally be available to further provides at least a second contact layer between the second electrode and the second channel buried layer. The second contact layer is made of an eighth compound semiconductor of a degenerate state, wherein the second electrode is made of a conductive metal to form an ohmic contact.

Any Group III-V compound semiconductors of a direction transition type as well as any Group II-IV compound semiconductors are available as the compound semiconductor of the quantum well layers. Group III elements are, for example, Al, Ga and In. Group V elements are, for example, P, As and Sb. Group II elements are, for example, Zn and Cd. Group IV elements are, for example, S and Se.

The present invention also provides a semiconductor laser which comprises the following elements. The semiconductor laser includes a substrate having a mesa structure portion having a flat top surface. The substrate is made of a first material having a resistivity.

The semiconductor laser also includes a multiple quantum well active layer being provided on the flat top surface of the mesa structure portion. The multiple quantum well active layer has a smaller resistivity than the resistivity of the first material of the substrate. The multiple quantum well active layer comprises alternating laminations of quantum well layers made of a first compound semiconductor having a first energy band gap and potential barrier layers made of a second compound semiconductor having a second energy band gap larger than the first energy band gap. Each of the quantum well layers has an electron ground state of quantum energy levels of electrons and a hole ground state of quantum energy levels of holes.

The semiconductor laser also includes a top layer being provided over the multiple quantum well active layer. The top layer is made of a second material having a resistivity higher than the resistivity of the multiple quantum well active layer.

The semiconductor laser also includes a first carrier injection guide layer being provided in contact with at least a first side wall of the mesa structure portion of the substrate, and also in contact with a first lateral end portion of the multiple quantum well active layer, as well as in contact with a first side wall of the top layer. The first carrier injection guide layer is made of a third compound semiconductor of a first conductivity type. The third compound semiconductor has a third energy band gap which is larger than a difference between the electron ground state and the hole ground state of the quantum well layers and smaller than the second energy band gap of the potential barrier layers.

The semiconductor laser also includes a second carrier injection guide layer being provided in contact with at least a second side wall of the mesa structure portion of the substrate, and also in contact with a second lateral end portion of the multiple quantum well active layer as well as in contact with a second side wall of the top layer. The second carrier injection guide layer is made of a fourth compound semiconductor of a second conductivity type. The fourth compound semiconductor has a fourth energy band gap which is larger than the difference between the electron ground state and the hole ground state of the quantum well lasters and substantially equal to or smaller than the second energy band gap of the potential barrier layers.

The semiconductor laser also includes a first channel buried layer being provided i-I contact with the first carrier injection guide layer and being separated via the first carrier injection guide layer from tie multiple quantum well active layer and from the mesa structure of the substrate as well as from the top layer. The first channel buried layer is made of a .fifth compound semiconductor of the first conductivity type having a fifth energy band gap larger than the third energy band gap of the first carrier injection guide layer.

The semiconductor laser also includes a first electrode being provided in contact with the first channel buried layer and being separated via the fast channel buried layer from the first carrier injection guide layer.

The semiconductor laser also includes a second channel buried layer being provided in contact with the second carrier injection guide layer and being separated via the second carrier injection guide layer from the multiple quantum well active layer. The second channel buried layer is made of a sixth compound semiconductor of the second conductivity type having a sixth energy band gap larger than the fourth energy band gap of the second carrier injection guide layer.

The semiconductor laser also includes a second electrode being, provided in contact with the second channel buried layer and being separated via the second channel buried layer from the second carrier injection guide layer.

Carriers of the first conductivity type are injected via the first carrier injection guide layer into the quantum well layers uniformly in a direction substantially parallel to interfaces between the quantum well layers and the potential barrier layers. As described above, the first carrier injection guide layer has the energy band gap smaller than the energy band gap of the potential barrier layers in the multiple quantum well active layer. The energy band gap of the first carrier injection guide layer is, however, larger than the difference between the ground state of the quantum energy levels of electrons confined in the quantum wells and the ground state of the quantum energy levels of holes confined in the quantum wells. This difference between the electron and hole ground states is necessarily larger than the energy band gap of the quantum well layers. Accordingly, the carriers of the first conductivity type, except for exceptional carriers thermally excited, are necessarily injected into the quantum well layers and well confined therein. Namely, almost all of the carriers of the first conductivity type are certainly injected into the quantum well layers uniformly. The above carrier injection structure provides an extremely high injection rate for the carriers of the first conductivity type into the quantum well layers. Further, the second carrier injection guide layer also has the energy band gap substantially equal to or smaller than the energy band gap of the potential barrier layers in the multiple quantum well active layer. The carriers of the second conductivity type are pulled toward the carriers of the first conductivity type confined in the quantum well layers by coulomb force and then injected into the quantum well layers even if the second carrier injection guide layer has an energy substantially equal to the energy band gap of the potential barrier layers. The energy band gap of the second carrier injection guide layer is, however, larger than the difference between the ground state of the quantum energy levels of electrons confined in the quantum wells and the ground state of the quantum energy levels of holes confined in the quantum wells. This difference between the electron and hole ground states is necessarily larger than the energy band gap of the quantum well layers. Accordingly, the carriers of the second conductivity type, except for exceptional carriers thermally excited, are necessarily injected into the quantum well layers and well confined therein. Namely, almost all of the carriers of the second conductivity type are certainly injected into the quantum well layers uniformly. Since the carriers of the first and second conductivity type, except for exceptional carriers thermally excited, are necessarily injected into the quantum well layers and well-confined therein, radiative recombinations of electron-hole pairs are caused at an extremely high probability. The above carrier injection structure provides an extremely light emission efficiency versus an injection current value, namely an extremely high slope efficiency.

The first and second materials my be either a semi-insulating material or an insulating material.

It may optionally be available that each of the quantum well layers is made of InGaAsP of a wavelength composition of 1.4 micrometers and has a thickness of 5.5 nanometers, and that each of the potential barrier layers is made of InGaAsP of a wavelength composition of 1.05 micrometers and has a thickness of 10 nanometers, wherein the difference between the electron ground state and the hole ground state of the quantum well layers corresponds to an energy converted into a wavelength of 1.3 micrometers. In this case, it may also be available that the fifth and sixth compound semiconductors of the first and second channel buried layer are made of InP. In this case, it may also be available that the multiple quantum well active layer comprises 15 periods of the quantum well layers and the potential barrier layers. In this case, it may also be, available that the third and fourth compound semiconductors of the first and second carrier injection guide layers comprise InGaAsP of a wavelength composition of 1.13 micrometers. In this case, it may also be available that the first and second carrier injection guide layers have a thickness of approximately 100 nanometers.

It may be available that each of the quantum well layers is made of InGaAsP of a wavelength composition of 1.4 micrometers and has a thickness of 6.2 nanometers, and that each of the potential barrier layers is made of InP and has a thickness of 10 nanometers, wherein the difference between the electron ground state and the hole ground state of the quantum well layers corresponds to an energy converted into a wavelength of 1.3 micrometers. In this case, it may also be available that the third and fourth compound semiconductors of the first and second carrier injection guide layers comprise InGaAsP of a wavelength composition of 1.13 micrometers. In this case, it may also be available that the third and fourth compound semiconductors of the first and second cattier injection guide layers comprise InP. In this case, it may also be available that the multiple quantum well active layer comprises 5 periods of the quantum well layers and the potential barrier layers. In this case, it may also be available that the first and second carrier injection guide layers have a thickness of approximately 100 nanometers.

It may be available that the quantum well layers and the potential barrier layers are strained layers.

It may also be available to further provide at least a first contact layer between the first electrode and the first channel buried layer. The contact layer is made of a seventh compound semiconductor of a degenerate state, wherein the first electrode is made of a conductive metal to form an ohmic contact. In this case, it may also be available further provide at least a second contact layer between the second electrode and the second channel buried layer. The contact layer is made of an eighth compound semiconductor of a degenerate state, wherein the second electrode is made of a conductive metal to form an ohmic contact.

Any, Group III-V compound semiconductors of a direction transition type as well as any Group II-IV compound semiconductors are available as the compound semiconductor of the quantum well layers. Group III elements are, for example, Al, Ga and In. Group V elements are, for example, P, As and Sb. Group II elements are, for example, Zn and Cd. Group IV elements are for example, S and Se.

The present invention also provides another semiconductor laser which comprises the following elements. The semiconductor laser includes a bottom layer provided on a top surface of a substrate. The bottom layer is made of a first material having a resistivity.

The semiconductor laser also includes a multiple quantum well active layer being provided on the bottom layer. The multiple quantum well active layer has a smaller resistivity than the resistivity of the first material of the bottom layer. The multiple quantum well active layer comprises alternating laminations Of quantum well layers made of a first compound semiconductor having a first energy, band gap and potential barrier layers made of a second compound semiconductor having a second energy band gap larger than the first energy band gap. Each of the quantum well layers has an electron ground state of quantum energy levels of electrons and a hole around state of quantum energy levels of holes.

The semiconductor laser also includes a top layer being provided over the multiple quantum well active layer. The top layer is made of a second material having a resistivity; higher than the resistivity of the multiple quantum well active layer.

The semiconductor laser also includes a first carrier injection guide layer being provided in contact with at least a first side wall of the bottom layer, and also in contact with a first lateral end portion of the multiple quantum well active layer, as well as in contact with a first side wall of the top layer. The first carrier injection guide layer is made of a third compound semiconductor of a first conductivity type. The third compound semiconductor has a third energy band gap which is larger than a difference between the electron ground state and the hole ground state of the quantum well layers and smaller than the second energy band gap of the potential barrier layers.

The semiconductor laser also includes a second carrier injection guide layer being provided in contact with at least a second sidle wall of the bottom layer: and also in contact with a second lateral end portion of the multiple quantum well active layer, as well as in contact with a second side wall of the top layer. The second carrier injection guide layer is made of a fourth compound semiconductor of a second conductivity type. The fourth compound semiconductor has a fourth energy band gap which is larger than the difference between the electron ground state and the hole -;round state of the quantum well layers and substantially equal to or smaller than the second energy band gap of the potential barrier layers.

The semiconductor laser also includes a first electrode being provided in contact with the first carrier injection guide layer and being separated via the first carrier injection guide layer from the multiple quantum active layer.

The semiconductor laser also includes a second electrode being provided in contact with the second carrier injection guide layer and being separated via the second carrier injection guide layer from the multiple quantum active layer.

Carriers of the first conductivity type are injected via the first carrier injection guide layer into the quantum well layers uniformly in a direction substantially parallel to interfaces between the quantum well layers and the potential barrier layers. As described above, the first carrier injection guide layer has the energy band gap smaller than the energy band gap of the potential barrier layers in the multiple quantum well active layer. The energy band gap of the first carrier injection guide layer is, however, larger than the difference between the ground state of the quantum energy levels of electrons confined in the quantum wells and the ground state of the quantum energy levels of holes confined in the quantum wells. This difference between the electron and bole ground states is necessarily larger than the energy band gap of the quantum well layers. Accordingly, the carriers of the first conductivity type, except for exceptional carriers thermally excited, are necessarily injected into the quantum well layers and well confined therein. Namely., almost all of the carriers of the first conductivity type are certainly injected into the quantum well layers uniformly. The above carrier injection structure provides an extremely high injection rate for the carriers of the first conductivity type into the quantum well layers. Further, the second carrier injection guide layer also has the energy band gap substantially equal to or smaller than the energy band gap of the potential barrier layers in the multiple quantum well active layer. The carriers of the second conductivity type are pulled toward the carriers of the first conductivity type confined in the quantum well layers by coulomb force and then injected into the quantum well layers even if the second carrier injection guide layer has an energy substantially equal to the energy band gap of the potential barrier layers. The energy band gap of the second carrier injection guide layer is, however, larger than the difference between the ground state of the quantum energy levels of electrons confined in the quantum wells and the ground state of the quantum energy levels of holes confined in the quantum wells. This difference between the electron and hole ground states is necessarily larger than the energy band gap of the quantum well layers. Accordingly, the carriers of the second conductivity type, except for exceptional carriers thermally excited, are necessarily injected into the quantum well layers and well confined therein. Namely, almost all of the carriers of the second conductivity type are certainly injected into the quantum well layers uniformly. Since the carriers of the first and second conductivity type, except for exceptional carriers thermally excited, are necessarily injected into the quantum well layers and well-confined therein, radiative recombinations of electron-hole pairs are caused at an extremely high probability. The above carrier injection structure provides an extremely light emission efficiency versus an injection current value, namely an extremely high slope efficiency.

The first and second materials may be either a semi-insulating material or an insulating material.

It may optionally be available that each of the quantum well layers is made of InGaAsP of a wavelength composition of 1.4 micrometers and has a thickness of 5.5 nanometers, and that each of the potential barrier layers is made of InGaAsP of a wavelength composition of 1.05 micrometers and has a thickness of 10 nanometers, wherein the difference between the electron ground state and the hole ground state of the quantum well layers corresponds to an energy converted into a wavelength of 1.3 micrometers. In this case, it may be available that the multiple quantum well active layer comprises 15 periods of the quantum well layers and the potential barrier layers. In this use, -i may be available that the third and fourth compound semiconductors of the first and second carrier injection guide layers comprise InGaAsP of a wavelength composition of 1.13 micrometers. In this case, it may be available that the first and second carrier injection guide layers have a thickness of approximately 100 nanometers.

It may be available that each of the quantum well layers is made of InGaAsP of a wavelength composition of 1.4 micrometer and has a thickness of 6.2 nanometers, and that each of the potential barrier layers is made of InP and has a thickness of 10 nanometers, wherein the difference between the electron ground state and the hole ground state of the quantum well layers corresponds to an energy converted into a wavelength of 1.3 micrometers. In this case, it may be available that the third and fourth compound semiconductors of the first and second carrier injection guide layers comprise InGaAsP of a wavelength composition of 1.13 micrometers. In this case, it may be available that the third and fourth compound semiconductors of the first and second carrier injection guide layers comprise InP. In this case, it may be available that the multiple quantum well active layer comprises 5 periods of the quantum well layers and the potential barrier layers. In this cause, it may be available that the first and second carrier injection guide layers have a thickness of approximately 100 nanometers.

It may be available that the quantum well layers and the potential barrier layers are strained layers.

It may be available to further provide at least a first contact layer between the first electrode and the first channel buried layer. The contact layer is made of a heavily doped compound semiconductor of a degenerate state, wherein the first electrode is made of a conductive metal to form an ohmic contact. In this case, it may be available to further provide at least a second contact layer between the second electrode and the second channel buried layer. The contact layer is made of a heavily doped compound semiconductor of a degenerate state, wherein the second electrode is made of a conductive metal to form an ohmic contact.

Any Group III-V compound semiconductors of a direction transition type as well as any Group II-IV compound semiconductors are available as the compound semiconductor of the quantum well layers. Group III elements are, for example, Al, Ga and In. Group V elements are, for example, P, As and Sb. Group II elements are, for example, Zn and Cd. Group IV elements are, for example, S and Se.

PREFERRED EMBODIMENTS

Figure 3:
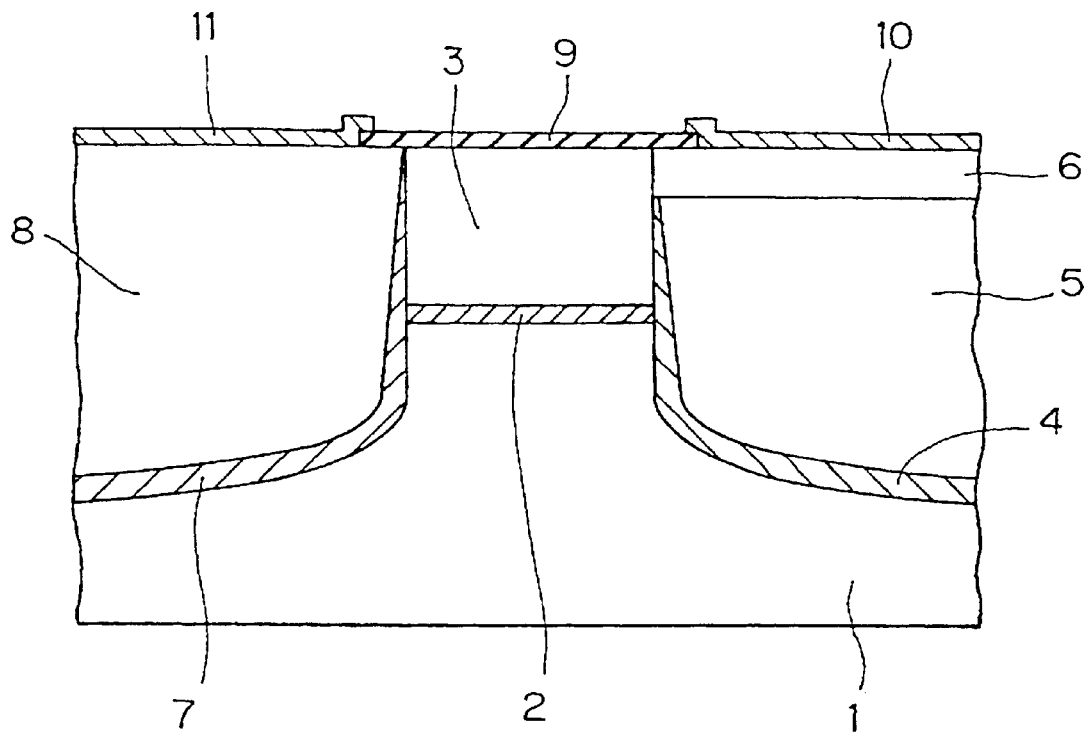
FIG. 3 is a fragmentary cross sectional elevation view illustrative of a novel laser device in a first embodiment according to the present invention.

A first embodiment according to the present invention will be described in with reference to FIGS. 3 and 4. A lateral carrier injection multiple quantum well distributed feed back laser is provided, which has an emission light of a wavelength of 1.3 µm. In FIG. 3, a semi-insulating InP substrate 1 has a diffracting, grating. The semi-insulating InP substrate 1 has a mesa structure portion which extends upwardly and has a flat top surface. A multiple quantum well active layer 2 is provided on the flat surface of the mesa structure portion of the semi-insulating InP substrate 1. An insulative or semi-insulating InP cladding layer 3 is provided on the multiple quantum well active layer 2. A p-type InGaAsP carrier injection guide layer 4 of a 1.13 µm wavelength composition is provided to extend on a right side of the semi-insulating InP substrate 1 and on a right side wall of the mesa structure portion, as well as on a right side end of the multiple quantum well active layer 2 and further on a right side wall of the InP cladding layer 3, except for its upper region. A p-type InP channel buried layer 5 is provided on the p-type InGaAsP carrier injection guide layer 4. A p-type highly doped InGaAs contact layer 6 in a degenerate state is provided over the p-type InP channel buried layer 5. A p-electrode 10 made of a metal is provided cover the p-type highly doped InGaAs contact layer 6 in a degenerate state to form an ohmic contact. An n-type InGaAsP caner injection guide layer 7 of a 1.13 µm wavelength composition is provided to extend on a left side of the semi-insulating InP substrate 1 and on a left side wall of the mesa structure portion, as well as on a left side end of the multiple quantum well active layer 2 and further on a left side wall of the InP cladding layer 3. An n-type InP channel buried layer 8 is provided on the n-type InGaAsP carrier injection guide layer 7. An n-electrode 11 made of a metal is provided over the n-type InP channel buried layer 8. A silicon oxide film 9 is provided on the top sur-ace of the InP cladding layer 3 so that the p-electrode 10 and the n-electrode 11 are separated from each other by the silicon oxide film 9. The silicon oxide film 9 extends on adjacent regions, to the cladding layer 3, of the p-.InP and n-InP channel buried layers 5 and 8. The multiple quantum well active layer 2 comprises 15 periods of alternating laminations of 15 quantum well layers made of InGaAsP of a 1.4 µm in wavelength composition, and potential barrier layers made of InGaAsP of a 1.05 µm wavelength composition. Each of the quantum well layers has a thickness of 5.5 nanometers. Each of the potential barrier layers has a thickness of 10 nanometers. Electron and hole ground states of the quantum well layers depend both on the thickness of the quantum well layer and the potential barrier layer and on the wavelength compositions or the energy band gaps of the quantum well layer and the potential barrier layer. Under the above conditions, a difference between the electron ground state and the hole ground state is 1.3 µm in a wavelength conversion.

Figure 4:
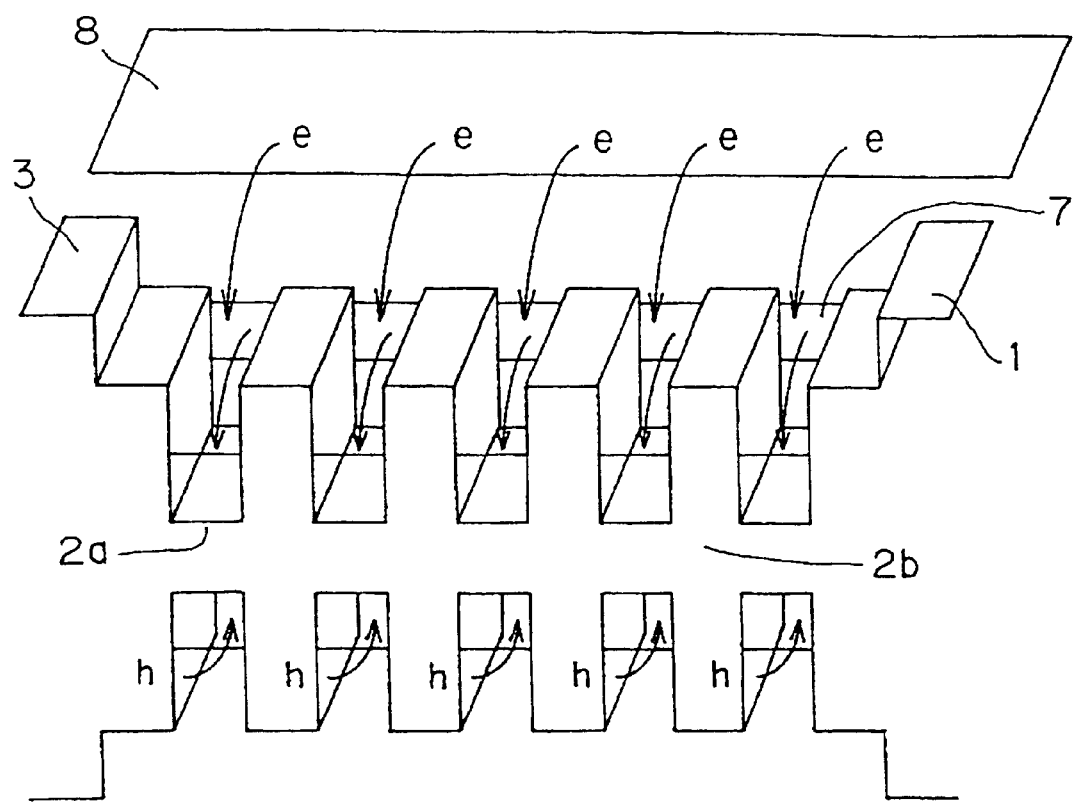
FIG. 4 is a diagram illustrative of energy band gap profiles of a novel laser device in a first embodiment according to the present invention.

FIG. 4 illustrates clergy, band gap profiles of the above structure of the laser, wherein energy beard gap profiles of the p-InP channel buried layer 5 and the p-InGaAsP carrier Injection guide layer 4 are not illustrated. These energy band gal) profiles of the p-InP channel buried layer 8 and the p-InGaAsP carrier injection guide layer 4 are the same as those of the energy band gap profiles of the n-InP channel buried layer 8 and the p-InGaAsP carrier injection guide layer 7 illustrated. "e" represents electron and "h" represents hole.

Electrons are supplied from the n-electrode 11 via the n-InP channel buried layer 8 into the n-InGaAsP carrier injection layer 7. On the other hand, holes are supplied from the p-electrode 10 via the p-type highly doped contact layer 6 and the p-InP channel buried layer 5 into the p-InGaAsP carrier injection layer 4. Electrons are injected via the n-InGaAsP carrier injection guide layer 7 into the quantum well layers uniformly in a direction substantially parallel to interfaces between the quantum well layers and the potential barrier layers. Holes are injected via the p-InGaAsP carrier injection guide layer 4 into the quantum well layers uniformly in a direction substantially parallel to interfaces between the quantum well players and the potential barrier layers. As described above, the n-InGaAsP Wand p-InGaAsP carrier, injection guide layers 7 and 4 have the energy band gap smaller than the energy band gap of the potential barrier layers in the multiple quantum well active layer 2. The energy band gap of each of the n-InGaAsP and p-InGaAsP carrier injection guide layers is, however, larger than the difference between the ground state of the quantum energy levels of electrons confined in the quantum wells and the ground state of the quantum energy levels of holes confined in the quantum wells. This difference between the electron and hole ground states is larger than the energy band gap of the quantum well layers. Accordingly, electrons existing in the n-InGaAsP carrier injection guide layer 7, except for exceptional carriers thermally excited, are necessarily injected into the quantum well layers but not the potential well layers and then well confined therein. Holes existing in the p-InGaAsP carrier injection guide layer 4, except for exceptional carriers thermally excited, are necessarily injected into the quantum well layers but not the potential well layers and then well confined therein. Namely, almost all of electrons existing in the n-InGaAsP carrier injection guide layer 7 are certainly injected into the quantum well layers uniformly. Almost all of holes existing in- the p-InGaAsP carrier injection guide layer 4 are also certainly injected into the quantum well layers uniformly, The above carrier injection structure provides an extremely high injection rate for the carriers into the quantum well layers. In each of the quantum well layers, radiative recombinations of electron-hole pairs are caused at an extremely high probability. The above carrier injection structure provides an extremely light emission efficiency, versus an injection current, value, namely an extremely high slope efficiency.

In order to measure power property of the laser, a cavity length was set at 300 µm. Further, front and rear facets were coated at reflectivities of 1% and 70% respectively Optical power properties of the above laser was measured at a room temperature. The threshold current measured was 5 mA. The slope efficiency measured was 0.6W/A. The above multiple quantum well active layer has a number of quantum well layers. This improves the differential gain. Under the, condition that a driving current is two times of the threshold current, a relaxation oscillation frequency measured was 12 GHz. The above threshold current, for example 5 mA, is lower by approximately 5 mA than a threshold current of the conventional laser free of any carrier injection guide layer. The, above slope efficiency, for example 0.6W/A, is higher by approximately 10% than that of the conventional laser free of any carrier injection guide layer. The above relaxation oscillation frequency measured, for example 12 GHz, is approximately 1.5 times of that of the conventional laser free of any carrier injection guide layer.

The above laser may be fabricated as follows. A diffraction grating is formed on a semi-insulating InP substrate 1 by using either an interference exposure method or an electron), beam exposure method. A multiple quantum well active layer 2 is grown on a top surface of the substrate 1 by using either a metal organic vapor phase epitaxy method or a molecular beam epitaxy, wherein the multiple quantum well active layer 2 comprises 15 periods of alternating laminations of 1.4 μm-InGaAsP quantum well layers having a thickness of 5.5 nanometers and 1.05 μm-InGaAsP potential barrier layers having a thickness of 10 nanometers. A semi-insulating InP cladding layer 3 is epitaxially grown over the multiple quantum well active layer 2. Left side parts of the semi-insulating InP cladding layer 3 and the multiple quantum well active layer 2, and further a left side part of an upper portion of the substrate 1 are selectively removed by a dry etching method or a -wet etching method to form a left side channel An n-InGaAsP carrier injection guide layer 7 having a thickness of 100 nanometers is grown on the etched surface by using, either a liquid phase epitaxy method or a metal organic vapor phase epitaxy method. An n-InP channel buried layer 8 is formed to bury the left side channel. Right side parts of the semi-insulating InP cladding layer 3 and the multiple quantum well active layer 2, and further a left side part of an upper portion of the substrate I are selectively removed by a dry etching method or a wet etching method to form a right side channel. A p-InGaAsP carrier injection guide layer 4 having a thickness of 100 nanometers is grown on the etched surface by using either a liquid phase epitaxy method or a metal organic vapor phase epitaxy method. A p-InP channel buried layer 5 is formed to bury the right side channel. A p-InGaAsP contact layer highly doped is formed over the p-InP channel buried layer 5. A silicon oxide film 9 is deposited on the top surface of the device by a chemical vapor deposition method. Left and night windows are formed in the silicon oxide film 9 so that the left and right windows are positioned over the n-InP channel buried layer 8 and The p-lnGaAs contact layer 6. A p-electrode 10 and an n-electrode 11 are formed in the right and left windows of the silicon oxide film 9 so that the p-electrode 10 and the n-electrode 11 are in contact with top surfaces of the p-InGaAs contact layer 6 and the n-InGaAsP channel buried layer 8.

Figure 5:
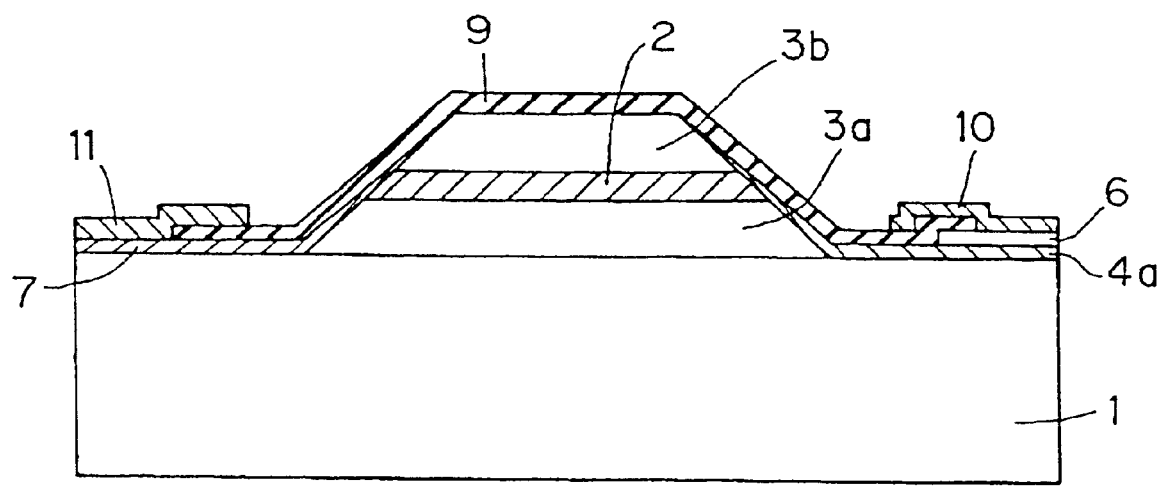
FIG. 5 is a fragmentary cross sectional elevation view illustrative of a novel laser device in a first embodiment according to the present invention.

A second embodiment according to the present invention will be described in with reference to FIG 5. A lateral carrier injection multiple quantum well laser is provided, which has an emission light of a wavelength of 1.3 μm. In FIG. 5, a semi-insulating InP substrate 1 has a diffracting grating. The semi-insulating InP substrate I is provided thereon with a mesa structure portion which extends upwardly and has a flat top surface. The mesa structure portion comprises a bottom semi-insulating InP cladding layer 3a provided on the top surface of the semi-insulating InP substrate 1, a multiple quantum well active layer 2 provided on the bottom semi-insulating InP cladding layer 3a, and a top semi-insulating InP cladding layer 3b provided on the multiple quantum well active layer 2. A p-type InP carrier injection guide layer 4a is provided to extend on a right side top surface of the semi-insulating InP substrate 1 and on a right side sloped wall of the mesa structure portion. A p-type highly doped InGaAs contact layer 6 in a degenerate state is selectively provided on a part of the p-type InP carrier injection guide layer 4a. A -p-electrode 10 made of a metal is provided over the p-type highly doped InGaAs contact layer 6 in a degenerate state to form an ohmic contact. An n-type InGaAsP carrier injection guide layer 7 of a 1.13 μm wavelength composition is provided to extend on a left side top surface of the semi-insulting InP substrate I and on a left side sloped wall of the mesa structure portion. An n-electrode 11 made of a metal is provided on a part of the n-type InGaAsP carrier injection guide layer 7. A silicon oxide film 9 is provided to extends not only on the top surface of the InP cladding layer 3b but also on the carrier injection guide layers 4a and 7 provided on the right and left sloped side walls of the mesa structure. The multiple quantum well active layer 2 comprises 5 periods of alternating laminations of 5 quantum well layers made of InGaAsP of a 1.4 μm wavelength composition, and potential barrier layers made of InP. Bach of the quantum well layers has a thickness of 6.2 nanometers. Each of the potential barrier layers has a thickness of 10 nanometers. Electron and hole ground states of the quantum well layers depend both on the thickness of the quantum well layer and the potential barrier layer and on the wavelength compositions or the energy band gaps of the quantum well layer and the potential barrier layer. Under the above conditions, a difference between the electron ground state and the hole ground state is 1.3 μm in a wavelength conversion.

Electrons are supplied from the n-electrode 11 into the n-InGaAsP carrier injection layer 7. On the other hand, holes are supplied from the p-electrode 10 via the p-type highly doped contact layer 6 into the p-InP carrier injection layer 4a. Electrons are injected via the n-InGaAsP carrier injection guide layer 7 into the quantum well layers uniformly in a direction substantially parallel to interfaces between the quantum well layers and the potential barrier layers. Holes are injected via the p-InP carrier injection guide layer 4a into the quantum well layers uniformly in a direction substantially parallel to interfaces between the quantum well layers and the potential barrier layers. As described above, the n-InGaAsP and p-InP carrier injection guide layers 7 and 4 have the energy band gaps respectively smaller than and equal to the energy band gap of the potential barrier layers in the multiple quantum well active layer 2. The energy band gaps of each of the n-InGaAsP and p-InGaAsP carrier injection guide layers are, however, larger than the difference between the ground state of the quantum energy levels of electrons confined in the quantum wells and the ground state of the quantum energy levels of holes confined in the quantum wells. This difference between the elect-on and hole ground states is larger than the energy band gap of the quantum well layers. Accordingly, electrons existing in the n-InGaAsP carrier injection guide layer 7, except for exceptional carriers thermally excited, are necessarily injected into the quantum well layers but not the potential well layers and then well confined therein. Holes existing in the p-InP carrier injection guide layer 4a, except for exceptional carriers thermally excited, are necessarily injected into the quantum well layers but not the potential well layers and then well confined therein. Namely, almost all of electrons existing in the n-InGaAsP carrier injection guide layer 7 are certainly injected in)to the quantum well layers uniformly, Almost all of holes existing in the p-InP carrier injection guide layer 4a are also certainly injected into-, the quantum well layers uniformly. The above carrier injection structure provides an extremely high injection rate for the carriers into the quantum well layers. In each of the quantum well layers, radiative recombinations of electron-hole pairs are caused at an extremely high probability. The above carrier injection structure provides an extremely light emission efficiency versus an injection current value, namely an extremely high slope efficiency. The p-InP carrier injection guide layer 4a having the same energy band gap than the potential barrier layer can prevent overflow of electrons into the p-InP carrier injection guide layer 4a.

In order to measure power property of the laser, a cavity length was set at 150 μm. Further, front and rear facets were coated at reflectivities of 70% and 95% respectively. The threshold currents measured at a room temperature and 85° C. were 1 mA and 2.5 mA respectively. The above threshold current, for example 1 mA and 2.5 mA, are 0.5 times of threshold currents of the conventional laser free of any carrier injection guide layer.

The above laser may be fabricated as follows. A diffraction grating is formed on a semi-insulating InP substrate 1 by using either an interference exposure method or an electron beam exposure method. A bottom semi-insulating InP cladding layer 3a is epitaxially grown over the semi-insulating InP substrate 1. A multiple quantum well active layer 2 is grown on a top surface of the bottom semi-insulating InP cladding layer 3a by using either a metal organic vapor phase epitaxy method or a molecular beam epitaxy, wherein the multiple quantum well active layer 2 comprises 5 periods of alternating lamination of 1.4 $\mu$m-InGaAsP quantum well layers having a thickness of 6.2 nanometers and 1.05 $\mu$m-InP potential barrier layers having a thickness of 10 nanometers. A top semi-insulating InP cladding layer 3b is epitaxially grown over the multiple quantum well active layer 2. Left side parts of the top and bottom semi-insulating InP cladding layers 3b and 3a and the multiple quantum well active layer 2 are selectively removed by a dry etching method or a wet etching method to from a sloped side wall of the mesa structure. An n-InGaAsP carrier injection guide layer 7 having a thickness of 100 nanometers is grown Con the etched surface by Using either a liquid phase epitaxy method or a metal organic vapor phase epitaxy method. Right side parts of the top and bottom semi-insulating InP cladding layer 3b and 3a and the multiple quantum well active layer 2 are selectively removed by a dry etching method or a wet etching method to form a right side channel. A p-InP carrier injection guide layer 4 having a thickness of 100 nanometers is grown on the etched surface by, using either a liquid phase epitaxy method or a metal organic vapor phase epitaxy method. A p-InGaAs contact layer highly doped is selectively formed on a part of the p-InP carrier injection guide layer 4a. A silicon oxide film 9 is deposited on the top surface of the device by a chemical vapor deposition method. Left and right windows are selectively formed in the silicon oxide film 9 so that the left and right windows are positioned over the n-InGaAsP carrier injection guide layer 7 and the p-InGaAs contact layer 6. A p-electrode 10 and an n-electrode 11 are formed in the right and left windows of the silicon oxide film 9 so that the p-electrode 10 and the n-electrode 11 are in contact with top surfaces of the p-InGaAs contact layer 6 and the n-InGaAsP carrier injection guide layer 8.

Whereas modification of the present invention will be apparent to a person having ordinary skill in the art, to which the invention pertains, it is to be understood that embodiments as shown and described by way of illustrations are by means intended to be considered in a limiting sense. Accordingly, it is intended to cover by claims all modifications which fall within the spirit and scope of the invention.

What is claimed is:

1. A semiconductor multilayer carrier injection structure comprising:

a horizontal multiple quantum well active layer comprising alternating laminations of quantum well layers made of a first compound semiconductor having a first energy band gap and potential barrier layers made of a second compound semiconductor having a second energy band gap larger than said first energy band gap, each of said quantum well layers having an electron ground state of quantum energy levels of electrons and a hole ground state of quantum energy levels of holes;

a first carrier injection guide layer perpendicular to said horizontal multiple quantum well active layer, said first carrier injection guide layer having an inside surface being in contact with first end portions of said alternating laminations, said first carrier injection guide layer being made of a third compound semiconductor of a first conductivity type, said third compound semiconductor having a third energy band gap which is larger than a difference between said electron ground state and said hole ground state of said quantum well layers and smaller than said second energy band gap of said potential barrier layers; and a first channel buried layer in contact with an outside surface of said first carrier injection guide layer, so that said first channel buried layer is separated in the horizontal direction by said first carrier injection guide layer from said multiple quantum well active layer, said first channel buried layer being made of a fourth compound semiconductor of said first conductivity type having a fourth energy band gap larger than said third energy band gap of said first carrier injection guide layer, wherein carriers of said first conductivity type are injected horizontally from said first channel buried layer across said first carrier injection guide layer into said quantum well layers uniformly and substantially in parallel to interfaces between said quantum well layers and said potential barrier layers.

2. The semiconductor multilayer carrier injection structure as claimed in claim 1, further comprising:

a second carrier injection guide layer extending perpendicular to the horizontal direction along which said multiple quantum well active layer extends, and said second carrier injection guide layer having an inside surface in contact directly with second end portions of said alternating laminations, said second carrier injection guide layer being made of a fifth compound semiconductor of a second conductivity type, said fifth compound semiconductor having a fifth energy band gap which is larger than said difference between said electron ground state and said hole ground state of said quantum well layers and smaller than said second energy band gap of said Potential barrier layers; and a second channel buried layer in contact with an outer surface of said second carrier injection guide layer, and said second channel buried layer being separated via said second carrier injection guide layer from said multiple quantum well active layer in the horizontal direction, said second channel buried layer being made of a sixth compound semiconductor of said second conductivity type having a sixth energy band gap larger than said third energy band gap of said first carrier injection guide layer, wherein carriers of said second conductivity type are injected horizontally from said second channel buried layer via said second carrier injection guide layer into said quantum well layers uniformly and substantially in parallel to interfaces between said quantum well layers and said potential barrier layers.

3. The semiconductor multilayer carrier injection structure as claimed in claim 1, further comprising:

a top layer being provided on a top surface of said multiple quantum well active layer, said top layer being made of a first material having a first resistivity higher than a resistivity of said first carrier injection guide layer and also higher than a resistivity of said potential barrier layers; and a bottom layer being provided on a bottom surface of said multiple quantum well active layer, said bottom layer being made of a second material having a second resistivity higher than a resistivity of said first carrier injection guide layer and also higher than a resistivity of said potential barrier layers.

4. The semiconductor multilayer carrier injection structure as claimed in claim 3, wherein said first material is a semi-insulating material.

5. The semiconductor multilayer carrier injection structure as claimed in claim 3, wherein said first material is an insulating material.

6. The semiconductor multilayer carrier injection structure as claimed in claim 3, wherein said second material is a semi-insulating material.

7. The semiconductor, multilayer carrier injection structure as claimed in claim 3, wherein said second material is an insulating material.

8. The semiconductor multilayer carrier injection structure as claimed in claim 1, further comprising a first electrode in contact with said first channel buried layer and separated via said first channel buried layer from said first carrier injection guide layer.

9. The semiconductor multilayer carrier injection structure as claimed in claim 8, wherein said fourth compound semiconductor of said first channel buried layer is made of InP.

10. The semiconductor multilayer carrier injection structure as claimed in claim 2, further comprising a second electrode in contact with said second channel buried layer and separated via said second channel buried layer from said second carrier injection guide layer.

11. The semiconductor multilayer carrier injection structure as claimed in claim 10, wherein said sixth compound semiconductor of said second channel buried layer is made of InP.

12. The semiconductor multilayer carrier injection structure as claimed in claim 1,
wherein each of said quantum well layers is made of InGaAsP of a wavelength composition of 1.4 micrometers and has a thickness of 5.5 nanometers,
wherein each of said potential barrier layers is made of InGaAsP of a wavelength composition of 1.05 micrometers and has a thickness of 10 nanometers, and
wherein said difference between said electron ground state and said hole ground state of said quantum well layers corresponds to an energy converted into a wavelength of 1.3 micrometers.

13. The semiconductor multilayer carrier injection structure as claimed in claim 12, wherein said multiple quantum well active layer comprises 15 periods of said quantum well layers and said potential barrier layers.

14. The semiconductor multilayer carrier injection structure as claimed in claim 12, wherein said third compound semiconductor of said first carrier injection guide layer comprises InGaAsP of a wavelength composition of 1.13 micrometers.

15. The semiconductor multilayer carrier injection structure as claimed in claim 1, wherein said first carrier injection guide layer has a thickness of approximately 100 nanometers.

16. The semiconductor multilayer carrier injection structure as claimed in claim 2,
wherein each of said quantum well layers is made of InGaAsP of a wavelength composition of 1.4 micrometers and has a thickness of 5.5 nanometers,
wherein each of said potential barrier layers is made of InGaAsP of a wavelength composition of 1.05 micrometers and has a thickness of 10 nanometers, and
wherein said difference between said electron ground state and said hole ground state of said quantum well layers corresponds to an energy converted into a wavelength of 1.3 micrometers, and
wherein said fourth compound semiconductor of said second carrier injection guide layer comprises InGaAsP of a wavelength composition of 1.13 micrometers.

17. The semiconductor multilayer carrier injection structure as claimed in claim 1, wherein said second carrier injection guide layer has a thickness of approximately 100 nanometers.

18. The semiconductor multilayer carrier injection structure as claimed in claim 1,
wherein each of said quantum well layers is made of InGaAsP of a wavelength composition of 1.4 micrometers and has a thickness of 6.2 nanometers,
wherein each of said potential barrier layers is made of InP and has a thickness of 10 nanometers, and
wherein said difference between said electron ground state and said hole ground state of said quantum well layers corresponds to an energy converted into a wavelength of 1.3 micrometers.

19. The semiconductor multilayer carrier injection structure as claimed in claim 18, wherein said third compound semiconductor of said first carrier injection guide layer comprises InGaAsP of a wavelength composition of 1.13 micrometers.

20. The semiconductor multilayer carrier injection structure as claimed in claim 18, wherein said third compound semiconductor of said first carrier injection guide layer comprises InP.

21. The semiconductor multilayer carrier injection structure as claimed in claim 18, wherein said multiple quantum well active layer comprises 5 periods of said quantum well layers and said potential barrier layers.

22. The semiconductor multilayer carrier injection structure as claimed in claim 2,
wherein each of said quantum well layers is made of InGaAsP of a wavelength composition of 1.4 micrometers and has a thickness of 6.2 nanometers,
wherein each of said potential barrier layers is made of InP and has a thickness of 10 nanometers,
wherein said difference between said electron ground state and said hole ground state of said quantum well layers corresponds to an energy converted into a wavelength of 1.3 micrometers, and
wherein said fourth compound semiconductor of said second carrier injection guide layer comprises InGaAsP of a wavelength composition of 1.13 micrometers.

23. The semiconductor multilayer carrier injection structure as claimed in claim 2,
wherein each of said quantum well layers is made of InGaAsP of a wavelength composition of 1.4 micrometers and has a thickness of 6.2 nanometers,
wherein each of said potential barrier layers is made of InP and has a thickness of 10 nanometers, and
wherein said difference between said electron ground state and said hole ground state of said quantum well layers corresponds to an energy converted into a wavelength of 1.3 micrometers, and
wherein said fourth compound semiconductor of said second carrier injection guide layer comprises InP.

24. The semiconductor multilayer carrier injection structure as claimed in claim 1, wherein said quantum well layers and said potential barrier layers are strained layers.

25. The semiconductor multilayer carrier injection structure as claimed in claim 8, further comprising a contact layer provided between said first electrode and said first channel buried layer, said contact layer being made of a seventh compound semiconductor of a degenerate state, wherein said first electrode is made of a conductive metal to form an ohmic contact.

* * * * *